United States Patent
Wang et al.

(10) Patent No.: US 9,503,096 B1
(45) Date of Patent: Nov. 22, 2016

(54) MULTIPLE-LAYER CONFIGURATION STORAGE FOR RUNTIME RECONFIGURABLE SYSTEMS

(71) Applicant: Futurewei Technologies, Inc., Plano, TX (US)

(72) Inventors: Qiang Wang, Santa Clara, CA (US); Zhenguo Gu, Plano, TX (US); Zhuolei Wang, Shenzhen (CN); Qiang Li, Shenzhen (CN)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 0 days.

(21) Appl. No.: 14/991,579

(22) Filed: Jan. 8, 2016

(51) Int. Cl.
*H03K 19/17* (2006.01)
*G06F 11/10* (2006.01)
*H03K 19/177* (2006.01)
*G06F 15/78* (2006.01)
*H04L 12/933* (2013.01)

(52) U.S. Cl.
CPC ......... *H03K 19/1776* (2013.01); *G06F 11/108* (2013.01); *G06F 15/7867* (2013.01); *H03K 19/17732* (2013.01); *H03K 19/17756* (2013.01); *H04L 49/109* (2013.01)

(58) Field of Classification Search
CPC .................. G06F 2015/768; G06F 17/5054; G06F 21/76; G06F 15/7867; G06F 11/141; G06F 12/0646; G06F 8/67; G06F 9/44505; H03K 19/17704; H03K 19/17708; H03K 19/17724; H03K 19/17728; H03K 19/1776; G05B 2219/13007; G05B 2219/25268; G11C 2029/0401; G11C 8/16; H04L 47/50; H04L 47/60; Y02B 60/1225
See application file for complete search history.

(56) References Cited

U.S. PATENT DOCUMENTS

| | | | | |
|---|---|---|---|---|
| 5,835,734 A | * | 11/1998 | Alkalaj | G06F 15/7867 710/104 |
| 6,769,081 B1 | * | 7/2004 | Parulkar | G11C 29/16 714/733 |
| 7,526,535 B2 | * | 4/2009 | Peck | G06F 9/44505 702/124 |
| 7,606,945 B2 | * | 10/2009 | Tatapudi | H04L 49/3054 370/386 |
| 8,643,519 B1 | * | 2/2014 | Kutz | H03M 1/1061 341/117 |
| 8,839,184 B1 | * | 9/2014 | Seguine | G06F 17/5054 716/110 |

* cited by examiner

*Primary Examiner* — Vibol Tan
(74) *Attorney, Agent, or Firm* — Futurewei Technologies, Inc.

(57) ABSTRACT

The disclosure relates to technology for configuring programmable logic devices having multiple programmable hardware units configurable in one or more functional modes. The programmable hardware units are coupled to independent switch devices (e.g., multiplexers) that select configuration patterns stored in a common and shared configuration memory. The configuration memory includes a set of configuration registers to store the configuration patterns, which configuration patterns correspond to the one or more functional modes. The configuration registers may be addressed using an index of addresses stored in memory that identify a select line in one of the switch devices for a particular programmable hardware unit. Each select line in a switch device corresponds to a particular one of the configuration registers storing the configuration pattern. The addressed configuration register is accessed to retrieve the configuration pattern and configure the programmable hardware unit.

27 Claims, 6 Drawing Sheets

MULTIPLE-LAYER CONFIGURATION STORAGE FOR RUNTIME RECONFIGURABLE SYSTEMS

BACKGROUND

Programmable integrated circuit devices such as field-programmable gate arrays (FPGAs), programmable logic devices (PLDs), complex programmable logic devices (CPLDs), system on a chip (SoC) and the like, may be configured to perform various functions. These programmable devices perform a configuration by reading configuration data from a program memory (e.g., read only memory or flash memory) and copying the configuration data to state registers (e.g., configuration registers) of the programmable device. Functional blocks (e.g., which perform user-defined logic functions), I/O blocks (e.g., which configure input/output blocks interfacing to external devices), and/or signal routing resources (e.g., which connect the functional blocks to the I/O blocks), for example, may be established this way.

A central processing unit (CPU) and/or a controller of the programmable device may be used to perform such configurations during a reset and/or runtime. However, only one configuration bit pattern is stored at runtime. Thus, the configuration may not be changed during runtime. Moreover, the configuration involves moving the configuration data from the program memory to the configuration registers, which is a time and resource consuming process. As the number of functions being performed increases, the amount of memory sufficient to configure the registers increases, thereby consuming valuable resources and increasing costs.

BRIEF SUMMARY

In one embodiment, there is a programmable logic device (PLD), including a configuration bus; a plurality of programmable hardware units coupled to the configuration bus, each of the programmable hardware units configurable with one of a plurality of functional modes; a plurality of switch devices to independently select one or more configuration patterns from a set of configuration patterns, each of the switch devices corresponding to one of the programmable hardware units; a plurality of configuration registers coupled to the configuration bus and commonly shared by the plurality of programmable hardware units, the configuration registers storing the set of configuration patterns, where each configuration pattern corresponds to one of the plurality of functional modes of the programmable hardware units; a memory storing a set of index groups, each index group including a set of indices, configured to identify one of the plurality of configuration registers by selecting a corresponding select line on a corresponding one of the switch devices using a corresponding index in the set of indices; and one or more of the plurality of programmable hardware units accessing the configuration pattern, via the configuration bus, from the selected configuration register for configuration with the configuration pattern retrieved from the selected configuration register.

In another embodiment, there is a method for configuring a programmable logic device (PLD), including storing a set of configuration patterns in commonly shared configuration registers of a configuration memory such that each of the configuration patterns correspond to one or more functional modes of a plurality of programmable hardware units; independently selecting one or more configuration patterns from the set of configuration patterns using one or more switch devices, each of the switch devices corresponding to one of the programmable hardware units; storing, in the index memory, an index of addresses configured to identify one of a plurality of select lines of the switching device to address a corresponding one of the plurality of configuration registers; and accessing one of the configuration patterns by addressing the configuration memory to select one of the plurality of configuration registers to configure one of the programmable hardware units with the configuration pattern retrieved from the selected configuration register.

In still another embodiment, there is a programmable logic device (PLD), including a plurality of programmable hardware units configurable with one of a plurality of functional modes; a plurality of switch devices to select a configuration pattern from a set of configuration patterns, each of the switch devices corresponding to one of the programmable hardware units; a plurality of configuration registers commonly shared by the plurality of programmable hardware units, the configuration pattern corresponding to one of the plurality of functional modes; a memory storing a set of index groups configured to identify one of the plurality of configuration registers by selecting a corresponding select line on a corresponding one of the switch devices using a corresponding index from a set of indices in one of the index groups; and one or more of the plurality of programmable hardware units accessing the configuration pattern from the selected configuration register for configuration with the configuration pattern retrieved from the selected configuration register.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate like elements.

DETAILED DESCRIPTION

The disclosure relates to technology for configuring programmable logic devices having multiple programmable hardware units configurable in one or more functional modes. The programmable hardware units are coupled to independent switch devices (e.g., multiplexers) that select configuration patterns stored in a common and shared configuration memory. The configuration memory includes a set of configuration registers to store the configuration patterns, which configuration patterns correspond to the one or more functional modes. The configuration registers may be addressed using an index of addresses stored in memory that identify a select line in one of the switch devices for a particular programmable hardware unit. Each select line in a switch device corresponds to a particular one of the configuration registers storing the configuration pattern. The addressed configuration register is accessed to retrieve the configuration pattern and configure the programmable hardware unit.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Figure 1:
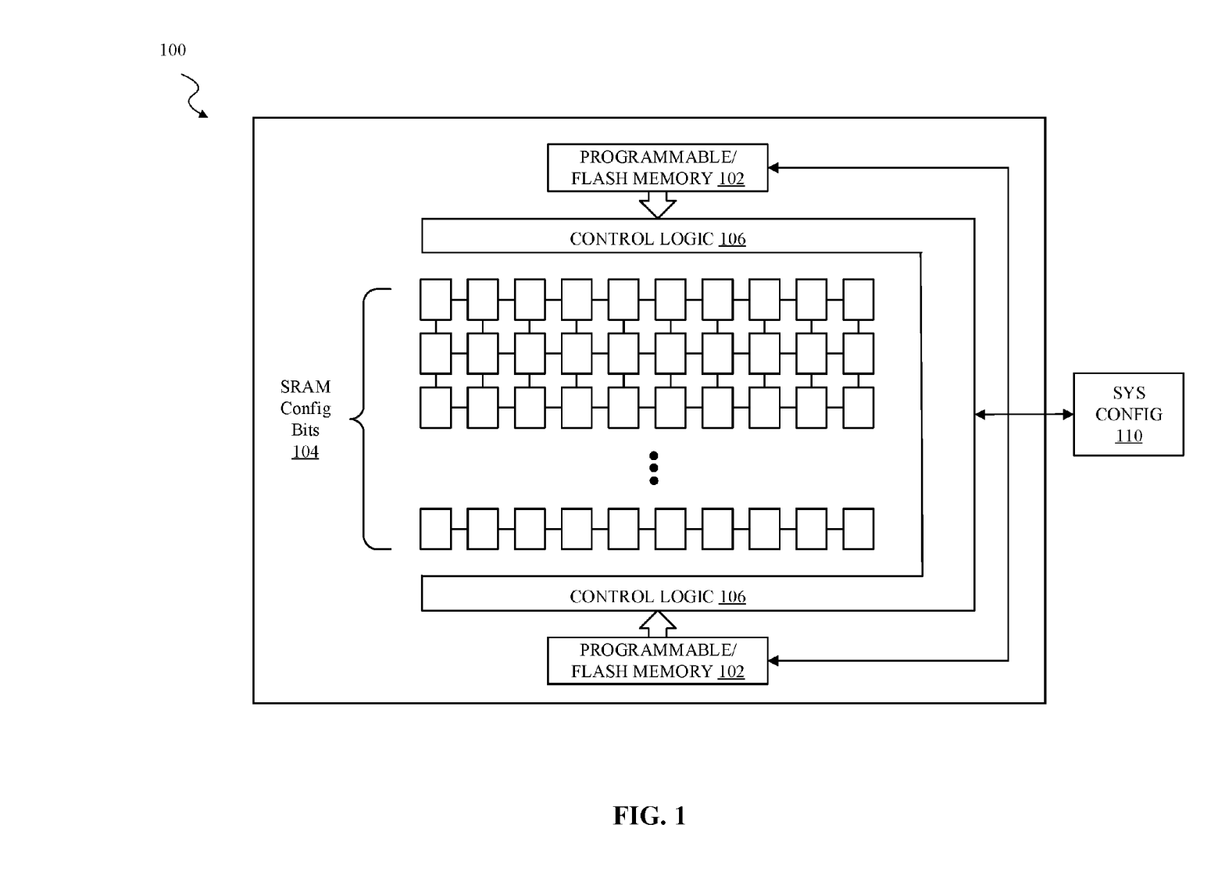
FIG. 1 shows a block diagram illustrating a programmable logic device.

FIG. 1 shows a block diagram illustrating a programmable logic device (PLD) 100 in accordance with one embodiment. PLD 100 includes programmable memory 102, such as electrically erasable programmable read only memory (EEPROM) or flash memory, and static random access memory (SRAM) 104. Programmable memory 102 is, for example, non-volatile (retains its state with power termination) memory used to store configuration data, which can be transferred to SRAM 104, via control logic 106, to configure PLD 100. SRAM 104, a volatile memory in which its state is lost when power is terminated, includes configuration memory cells used to store configuration data that configures PLD 100 for its intended (various) functionality.

It should be understood that programmable memory 102 may be any type of non-volatile memory, including, but not limited to, various types of non-volatile memory that can be reprogrammed once or repeatedly. Furthermore, SRAM 104 may be programmed (i.e., loading and storing information into the memory) to store configuration data for PLD 100, but the device functionality of PLD 100 is determined by the information stored in SRAM 104. Thus, PLD 100 is configured or reconfigured when information is programmed into SRAM 104.

Programmable memory 102 and SRAM 104 within PLD 100 may be programmed using various techniques as understood by the skilled artisan. For example, programmable memory 102 may be programmed or reprogrammed using conventional standards such as the Institute of Electrical and Electronics Engineers (IEEE) 1149.1 or 1532 standards. As another example, SRAM 104 may be programmed or reprogrammed via a central processing unit (CPU) (not shown) as part of the system configuration 110. SRAM 104 may also be programmed via programmable memory 102 under the direction of conventional control logic 106. By combining flash memory 102 and SRAM 104, a single integrated circuit (i.e., chip) solution is provided.

The configuration memory cells of SRAM 104 are used in a conventional manner to store configuration data, which determines the user defined functions of PLD 100 (e.g., determines programmable functions of I/O blocks and logic blocks). Control logic 106 may control the transfer of the configuration data from programmable memory 102 to the configuration memory cells of SRAM 104, as would be understood by one skilled in the art. The configuration memory cells contain registers used for configuring logic blocks of the programmable device, such as configuring input/output resources, programmable analog blocks, programmable digital blocks, routing resources, etc. The number of configuration registers may be quite large on complex programmable devices.

Either programmable memory 102 or the configuration memory cells of SRAM 104 may be programmed (i.e., receive and store information in its memory) to store configuration data for PLD 100. However, the device functionality of PLD 100 is determined by the information stored in configuration memory cells of SRAM 104. Thus, PLD 100 is configured (including reconfiguration or partial reconfiguration) when information is programmed into configuration memory cells of SRAM 104.

Figure 2:
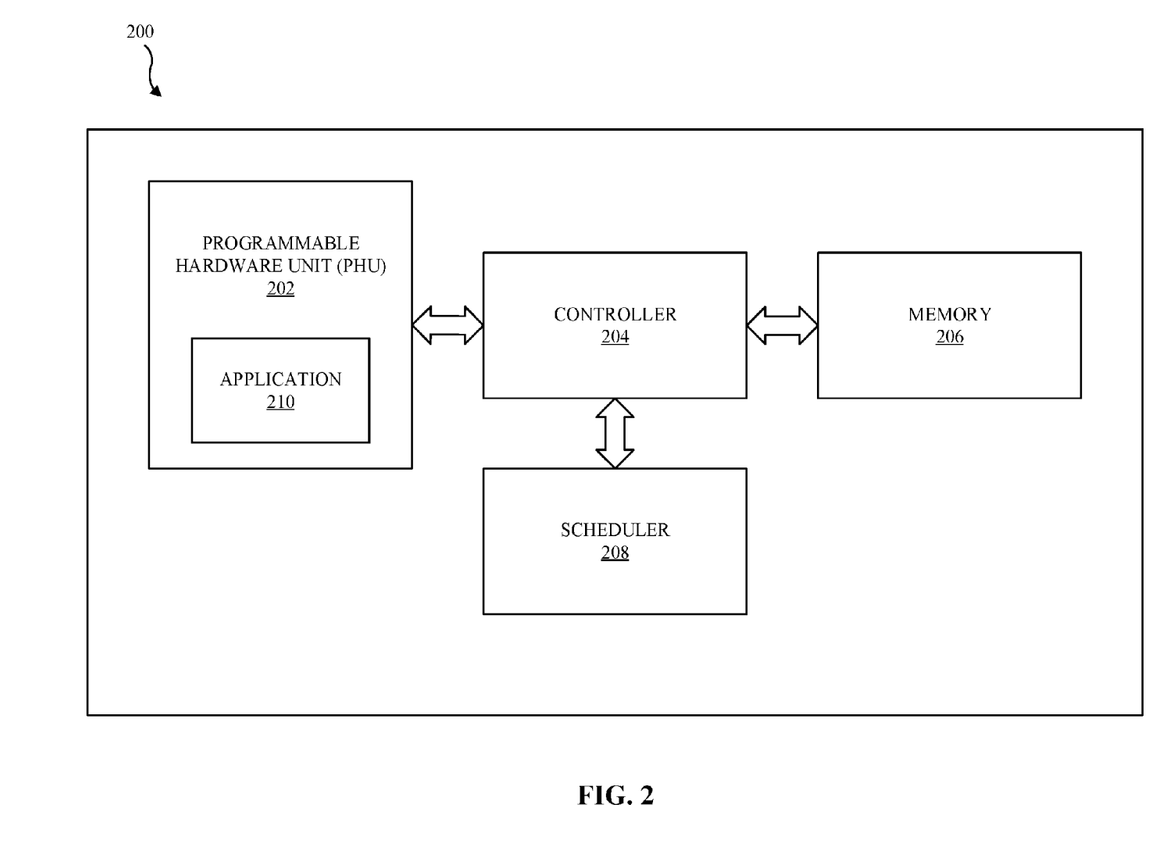
FIG. 2 illustrates a block diagram of an integrated circuit for configuring runtime hardware.

FIG. 2 illustrates a block diagram of an integrated circuit for configuring runtime hardware. In particular, the diagram illustrates an integrated circuit (IC) 200, such as a System on a Chip (SoC) or application-specific integrated circuit (ASIC), for programmable hardware unit 202 for an application 210 at runtime. As depicted in FIG. 2, IC 200 includes programmable hardware unit (PHU) 202, a memory 206, a controller 204 coupled to memory 206, and a scheduler 208.

Application 210, can be for example, but is not limited to a multimedia application, a wireless communication application, a gaming application, and a security application. The PHU 202 may include more than one application 210 and/or the application 210 may include one or more sub-applications (not shown).

The controller 204 may be any processor that configures and exchanges the configuration data stored in the configuration memory of the PHU 202. By doing so, the PHU 202 can be used for a variety of purposes.

The scheduler 208 is coupled with controller 204 and is configured, in one embodiment, to provide access by the controller 204 to an index of addresses which may select any number of PHUs 202 (discussed below).

Figure 3:
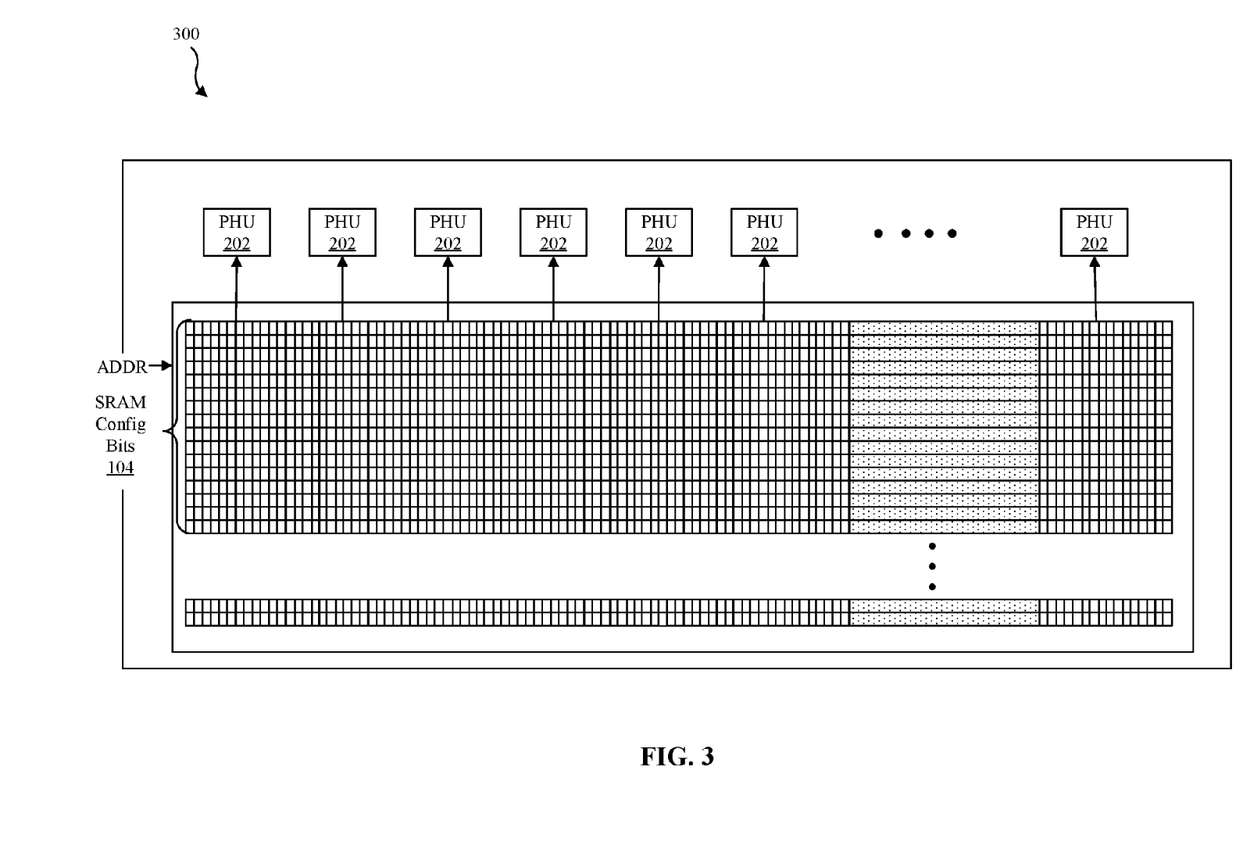
FIG. 3 illustrates a configuration memory supporting programmable hardware in accordance with FIGS. 1 and 2.

FIG. 3 illustrates a configuration memory supporting programmable hardware units during runtime in accordance with FIGS. 1 and 2. Runtime reconfigurable hardware can be used to achieve high performance with customized hardware features. An advantage of runtime configurable hardware systems is that usage scenarios may be categorized into separated modes, where an individual programmable hardware unit (PHU) 202 may be configured with a corresponding functional mode. Thus, as a result of switching the functional mode of the programmable hardware units 202, the configurable hardware system can offer optimal performance for each of the various usage scenarios.

For example, a system equipped with PHUs 202 requires storage to store bit patterns (configuration patterns) corresponding to the configuration memory (SRAM 104 in this example). The effectiveness of the PHUs 202 to the system depend on whether each functional mode for a specific usage scenario is properly applied (i.e., the correct functional mode is applied for a specific usage scenario). Moreover, the PHUs 202 are most effective when the functional modes stored in the configuration memory cover a majority of usage scenarios in the system. For example, if there are 32 functional modes in a system, and 26 of the functional modes cover 90% of the usage scenarios, then the PHUs 202 are most effective when programmed to cover those 26 functional modes.

As depicted in the embodiment of FIG. 3, A PLD 300 (such as the PLD described in FIGS. 1 and 2) includes programmable hardware units (PHU) 202 and a dedicated memory having a specified number of configuration bit cells (or registers) of SRAM 104. The PLD 300 can include any number of PHUs 202, where the dedicated configuration memory of SRAM 104 is the same size and contains the same content as each of the other configuration memories corresponding to each of the other PHUs 202.

Functional modes of the PHUs 202 may be implemented by configuring binary bit patterns (configuration patterns) into the configuration memory of a corresponding PHU 202. For example, configuration patterns corresponding to a functional mode may be stored in configuration memory cells of SRAM 104. Configuring bit patterns stored in the configuration memory cells of SRAM 104 allows a controller or processor, such as controller 204 in FIG. 2, of the system to retrieve the configuration patterns from memory and program a corresponding one of the PHUs 202 to change from one functional mode to another functional mode. Thus, the PHUs 202 may be tailored for specific tasks (modes) and improve efficiency of performance over the cost of power and silicon area.

With reference to the embodiment, there are a number ($N_{units}$) of PHUs 202, where each PHU 202 includes a number ($C_{unit}$) of bits of configuration memory cells of SRAM 104 in order to operate in any number ($D_{depth}$) of functional modes. The number ($C_{unit}$) of bits of configuration memory cells form the configuration pattern (or bit pattern) to set any one specific functional mode (of the $D_{depth}$ functional modes) in the PHU 202.

In order to support a number ($D_{depth}$) of functional modes, a same number ($D_{depth}$) of configuration patterns are utilized. That is, $D_{depth}$ configuration patterns represent $D_{depth}$ functional modes. To select any one of the number ($D_{depth}$) of configuration patterns stored in a dedicated configuration memory, the system stores an index of address lines ($A_{Addr}$) for each of the dedicated configuration memories. The index of address lines enables the system to select an address line (select line) corresponding to a configuration pattern stored in the dedicated configuration memory of a PHU 202.

The total storage size (i.e., the dedicated configuration memory for each of the PHUs) to operate in each of the ($D_{depth}$) functional modes is therefore defined by the number of PHUs and the number of bits of configuration memory cells. More specifically, since there may be any number ($N_{units}$) of PHUs 202, each of which may be independently configured using the dedicated configuration memory, and a number ($C_{unit}$) of bits of configuration memory cells (registers), the total storage size to operate in each of the ($D_{depth}$) functional modes is $C_{unit} \times N_{units}$.

Accordingly, in a PLD having $N_{units}$ PHUs with $D_{depth}$ functional modes, each of which functional mode is programmed (configured) by a configuration pattern having $C_{unit}$ bits of configuration memory cells for each PHU, the total size of the configuration storage is represented by the following equation: width of configuration storage (registers)=$N_{units} \times C_{unit}$ bits for functional modes (configuration patterns) having a depth of $D_{depth}$.

For illustrative purposes, in one non-limiting example, the PLD has thirty-two (32) PHUs. Each PHU 202 has sixty-four (64) different functional modes, where each functional mode uses a configuration memory (of configuration registers) to store the corresponding configuration pattern. In the embodiment, the configuration register storing each functional mode is twenty-four (24) bits (i.e., each configuration pattern has 24 bits). In order to independently set each of the PHUs 202 to a functional mode, the system mode utilizes 32×24 bits ($N_{units} \times C_{unit}$ bits) of memory to address $D_{depth}$ functional modes.

Figure 4:
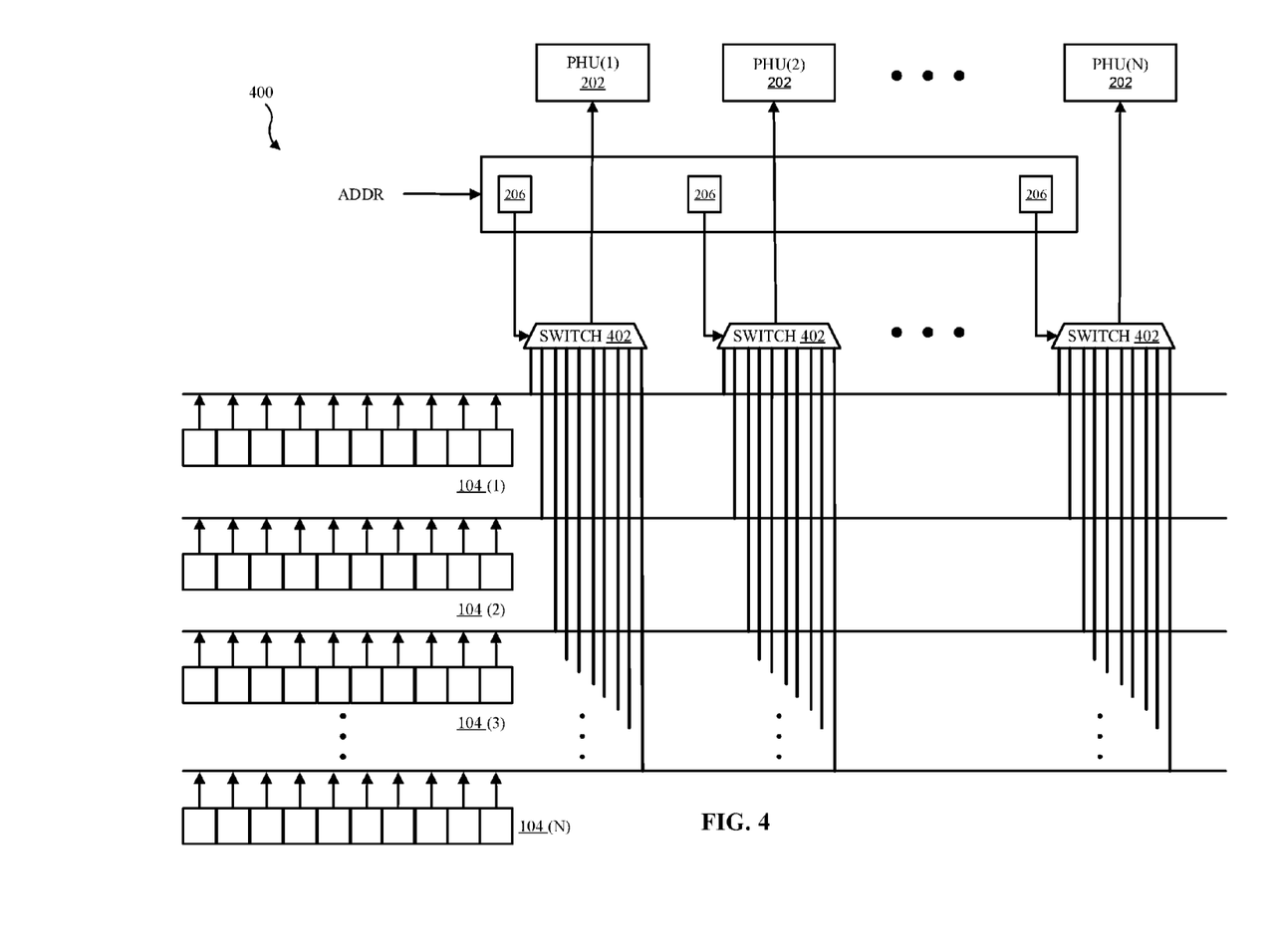
FIG. 4 illustrates a two-layer configuration memory architecture in accordance with FIGS. 1 and 2.

FIG. 4 illustrates a multiple-layer configuration memory architecture in accordance with FIGS. 1 and 2. The multiple-layer configuration architecture in the disclosed embodiment, as will become clear from the discussion below, reduces the size of the total storage (for example the storage described with reference to FIG. 3), thereby reducing the power consumption and the silicon area.

In the non-limiting example of FIG. 4, a PLD 400 includes PHUs 202(1) to 202(N), memory 206, switch devices 402(1) to 402(N) and a shared (common) configuration memory with configuration registers 104(1) to 104(N). A shared (or common) configuration memory as used in this document is defined as a group or set of configuration registers (memory cells) that together form the configuration memory that is accessible by each of the PHUs 202 via switch devices 402. That is, a single configuration memory is accessible by each of the PHUs 202, as opposed to having a dedicated configuration memory for each of the PHUs, as described with above with reference to FIG. 3.

In the embodiment, each PHU 202 is coupled to a switch device 402. The switch device may be, for example, a multiplexer that is accessed by providing the address of the multiplexer 402 and a selection bit of any one of the selection lines (represented by the vertical lines protruding from each multiplexer) on the multiplexer 402. The address lines are stored as an index of address lines, for example, in memory 206.

Memory 206 stores a set of index groups, with each group containing the same number of indices corresponding to the PHUs 202. Each index in a group is used as selection lines of the corresponding multiplexer (switch) 402, and the values on the indices in a group identify a functional mode of the PLD, with each of the PHUs 202 being configured by the configuration register contents (through a configuration bus) selected by the corresponding index.

The PLD can be configured to a particular functional mode by sending a new address to memory 206, reading a corresponding group (stored in a memory word), and each of the indices in the group selecting corresponding configuration registers through the associated multiplexers and configuration busses. In this manner, the PHUs 202 are fetched with configuration bit-patterns (contents of the corresponding registers), and the PHUs 202 are configured in the corresponding functional modes. By changing the address to the memory 206, a different group of indices can be read out from the memory 206 and the functional modes of the PHUs 202 can be changed simultaneously.

Each of the selection lines of a multiplexer 402 is coupled to a respective one of the configuration registers 104, where each configuration register is configured with a configuration pattern (corresponding to a functional mode). Each configuration register's output data is coupled to the selection line of the multiplexer 402. When the multiplexer 402 is addressed (ADDR), the specified selection line may retrieve the configuration pattern from the corresponding configuration register 104. Thus, each PHU 202 can choose any one of the configuration registers 104 in the configuration memory to retrieve a configuration pattern by setting the select bits of the dedicated multiplexer. For example, each switch device requires a number of selection lines. If the total number of inputs is $D_{depth}$ and the total number of selection lines is S, then $D_{depth}=2^S$. Additionally, each index identifies one among the $D_{depth}$ configuration registers. Thus, if the total number of PHUs is $N_{units}$, then each memory word stores a group of $N_{units}$ indices, with each of the indices independently selecting a configuration register through an input on the corresponding switch device.

As appreciated, in conventional PHUs, there are typically numerous identical programmable units. That is, each the PHUs can be configured to the same set of functions where each PHU may be selected to operation any one of the functions in that set. Traditionally, each PHU uses a dedicated register/memory to hold the corresponding configuration bit-pattern (or, binary bits, e.g. "011010111 . . . ") to operate in a selected function mode. Accordingly, the total number of functions in the set determines the depth of memory that holds all of the configuration bit-patterns corresponding functions in the set.

In one embodiment, the bit-width of the configuration bit-pattern is wider than the number of binary bits used to specify a particular functional mode within the set. For example, the configuration memory cells 104 (registers) are wider that the memory cells used to address (ADDR) memory 206. Therefore, using a common set of registers (with each register storing a configuration pattern corresponding to one functional mode in the function set), each PHU 202 uses fewer bits to select one of the configuration registers in the set using an index number. That is, the bit width of the index used to select a function for each of the PHUs 202 is narrower than the bit width of the configuration bit patterns.

In a non-limiting example, assume the total number of functions in the set for the PHUs is 64, then the bit width for the index to select any one of the registers is 6 ($2^6$=64), the total number of PHUs 202 is 40, the length of the configuration bit pattern is 50, and the programmable logic device (PLD) supports dynamic reconfiguration among 48 different functional modes (the total number of modes for the PLD may or may not equal the total number of functional modes for the individual PHUs). Thus, 64 registers may hold the common configuration bit patterns (50×64 bits), and a memory having 40×6×48 bits may store the corresponding selections for all PHUs 202. Applying the conventional approach as described above, on the other hand, uses memory to store bit patterns for all of the PHUs 202 (40×50×48 bits). Accordingly, the reduction in memory required to store bits is calculated as: 40×50×48 (conventional)−[40×6×48 (memory)+50×64 (configuration bit patterns)]=87,680 bits. Thus, a reduction of 87,680 bits is realized, which is approximately a 91% reduction in memory space.

In one embodiment, when the total number of registers increases (e.g., the bit width of the index is much wider than 6), and the total number of PHUs 202 is much larger (e.g., the total length of the index memory word is much wider than 32×6), a second layer of registers may be used to store a shared (or common) copy of indices and memory used as the storage for the second layer indices to (1) identify a second layer register, and (2) use the contents of the identified register as the first layer index to address the configuration registers.

In another non-limiting example, a PLD may have thirty-two (32) PHUs 202 that operate using sixty-four (64) different functional modes. To store each of the 64 functional modes, a set of 64 registers stores 64 configuration patterns. In the embodiment, the 64 configuration registers 104 are shared by the 32 PHUs 202 (instead of 32 copies of dedicated memory for each PHU). To access the shared configuration memory, a multiplexer 402 associated with a PHU 202 is addressed to independently select any one of the 64 configuration registers 104 storing the configuration pattern (as described above, by selecting the corresponding input line on the associated multiplexer). Each of other PHUs 202 may also independently address and select (either serially or in parallel) any one of 64 configuration registers 104 through an associated multiplexer.

Thus, for a digital system containing $N_{units}$ PHUs, the common collection of configuration bit patterns (i.e. common memory) can be commonly shared among the PHUs 202 such that each PHU 202 can independently select one of the configuration patterns through a dedicated addressing multiplexer 402. Implementing the architecture of FIG. 4, the total storage required is significantly reduced compared to the total storage of FIG. 3. Specifically, the total size of the configuration storage ($N_{units} \times C_{unit}$ bits for functional modes (configuration patterns) having a depth of $D_{depth}$) in the architecture of FIG. 3 may be replaced by commonly shared $N_{units}$ configuration registers, $N_{units}$ independent (dedicated) addressing switch devices, and an address storage having a width of $N_{units} \times$depth of $A_{Addr}$.

Figure 5:
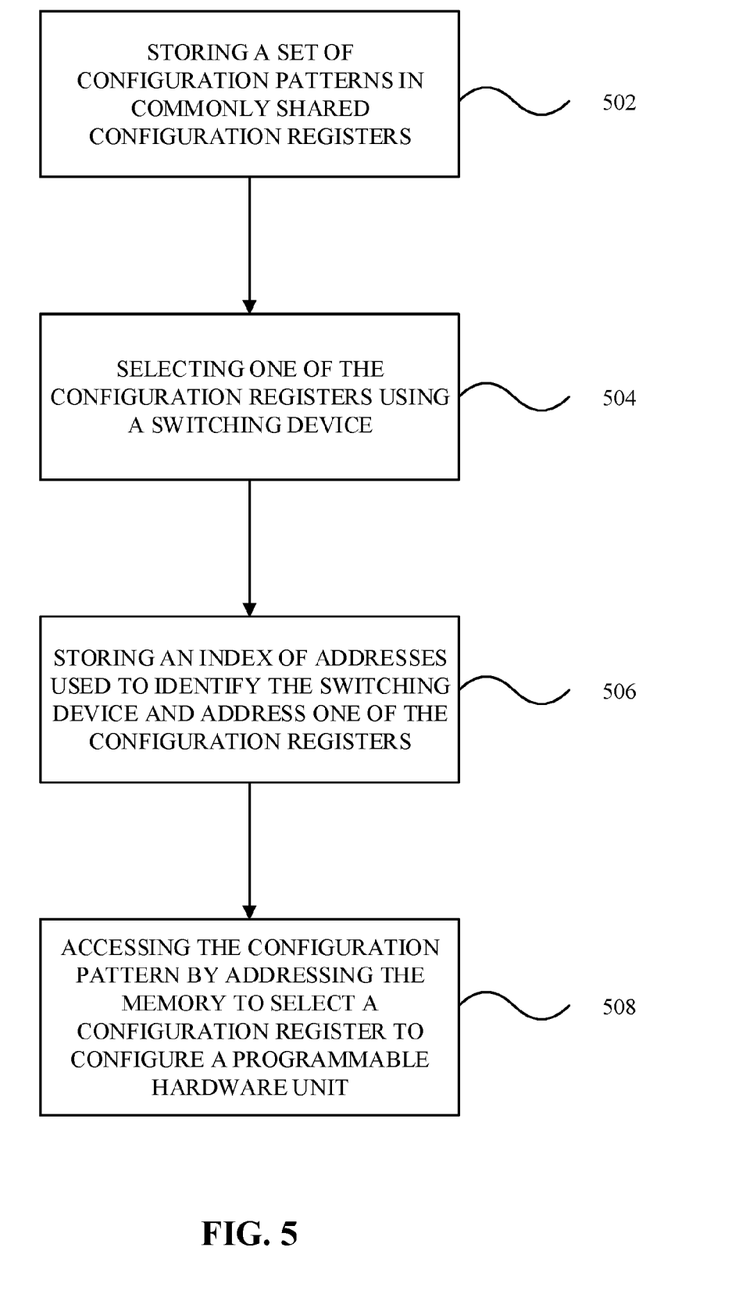
FIG. 5 illustrates a flow diagram of configuring a programmable logic device in accordance with FIGS. 1-4.

FIG. 5 illustrates a flow diagram of configuring a programmable logic device in accordance with FIGS. 1-4. A programmable logic device, such as PLD 100, may be configured during runtime by a processor, such as controller 204. At 502, a set of configuration patterns is stored in a group of configuration registers 104 commonly shared with PHUs 202 in the PLD 100. Each of the configuration patterns correspond to one or more functional modes of the PHUs 202. At 504, a switch device 402, corresponding to one of the PHUs 202, independently selects one or more configuration patterns from the set of configuration patterns stored in the configuration registers 104. The selection is implemented using an index of addresses stored in memory at 506. The index of addresses identifies the switching device 404 corresponding to the PHU 202. Each of the switch devices 202 has a number of select lines corresponding to the number of different configuration patterns (functional modes) stored in the configuration registers 104, as depicted in FIG. 4. Selecting a select line of the switching device 404 addresses a corresponding configuration register 104. At 508, a processor accesses the configuration pattern from the addressed configuration register 104, which configuration patter is used to configure the PHU 202 after retrieved from the selected configuration register 104.

The architecture using commonly shared configuration patterns for PHUs 202 enables multiple configuration patterns to be read out at the same time through different addressing switch devices 402, thereby alleviating any requirement that each PHU 202 has a dedicated configuration memory. Additionally, using configuration registers 104 allows the system to operate in parallel by both reading configuration patterns from a first set of configuration registers and reloading a second set of the configuration registers with new contents (e.g., new configuration patterns), which new contents may not be currently stored in the configuration registers. Thus, with the commonly shared configuration registers 104 and the capability of reloading the configuration registers 104 for storing additional configuration bit patterns, costs are reduced for the programmable hardware system to achieve the best performance.

Additionally, it is appreciated that the functional modes programmed into the PHUs 202 may not be consistently executed in the system. Thus, some functional modes may operate more frequently than other functional modes. Therefore, an optimal number of configuration registers 104 may be selected to cover the most frequently used mode while reserving a smaller number of additional configuration registers 104 to reload less frequently used modes. In one embodiment, the optimized number of configuration registers 104 may be selected such that a total number of configuration registers 104 is less than the total number of functional modes being utilized by the PHUs 202, thereby further reducing the size of total storage and costs associated therewith.

Figure 6:
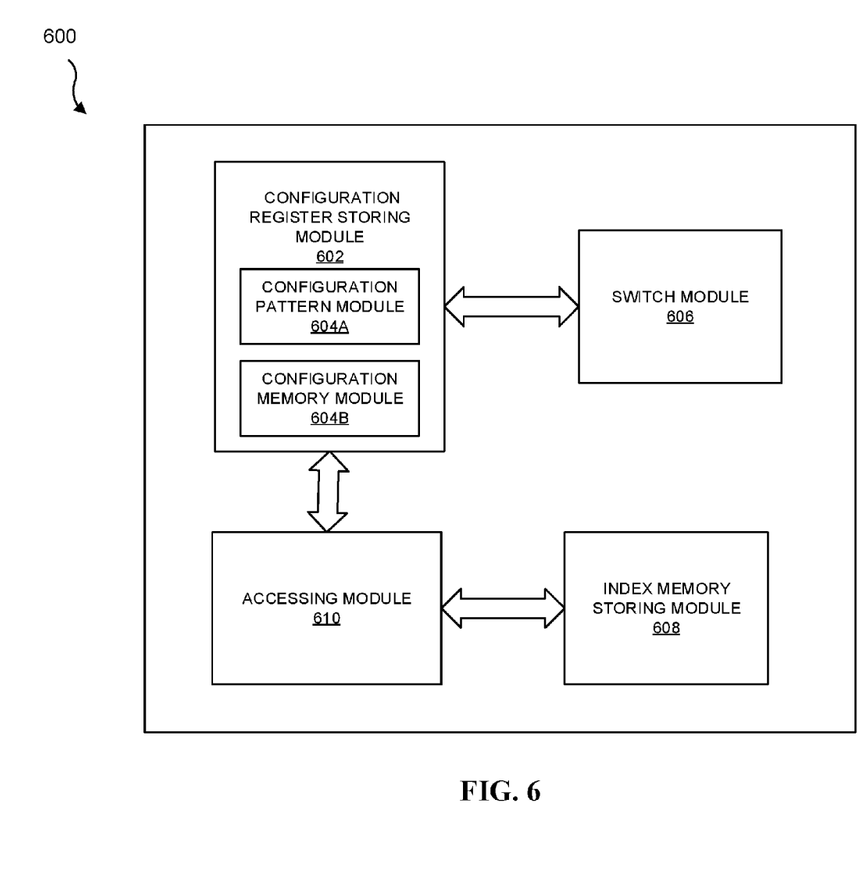
FIG. 6 illustrates a configurable and programmable logic device in accordance with the present disclosure.

FIG. 6 illustrates a configurable and programmable logic device in accordance with the embodiment disclosed in FIG. 5. The programmable logic device 600 includes, for example, a configuration register storing module 602 (including a configuration pattern module 604A), a switch module 606, an index memory storing module 608 and an accessing module 610. The configuration register storing module 602 processes and stores a set of configuration patterns in commonly shared configuration registers of a configuration memory module 604B. In one embodiment, the configuration pattern module 604A processes data in the configuration registers such that each of the configuration patterns correspond to one or more functional modes of a plurality of programmable hardware units 202. Switching module 606, which may be for example a multiplexer, software coded as a switch, etc., is configured to independently select one or more configuration patterns in the configuration register storing module 602 from the set of configuration patterns in the configuration pattern module 604, where the switch module 606 is operable to select a corresponding one of the programmable hardware units 202. The index memory storing module 608 is configured to store an index of addresses configured to identify one of a plurality of select lines of the switching module 606 to address a corresponding one of the plurality of configuration registers. The configuration patterns are accessed, via the accessing module 610, by addressing the configuration memory to select one of the plurality of configuration registers to configure one of the programmable hardware units 202 with the configuration pattern retrieved from the selected configuration register.

The disclosure also provides several advantages and benefits, including but not limited to, by providing an optimization mechanism in programmable logic devices to reduce the size of storage, thereby reducing hardware costs for storage and requiring less power. By virtue of this arrangement, higher performance may be achieved on reconfiguration of configuration registers by providing simultaneous retrieval and updating of the contents (e.g., configuration patterns) in the configuration registers. Moreover, the arrangement provides for application of layering repeated patterns into an index of addresses for use in integrated circuit designs, as well as maximizing the ability to share configuration patterns among all of the programmable hardware units. Additionally, a runtime system controller can schedule the operation of updating the contents (e.g., configuration patterns) of the configuration registers and read the configuration registers for configuring the programmable hardware units. Finally, the configuration patterns, as well as the decision on when configurations are needed, are part of an object system.

The embodiments have been described with respect to programmable logic circuits. However, the method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs) logic cell arrays (LCAs), field programmable gate arrays (FPGAs), application specific standard products (ASSPs), application specific integrated circuits (ASICs), and the like.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in a communications network, such as an ICN network. In another embodiment, the programmable logic device may be incorporated into a base station, mobile device or any other component in a communications network as readily appreciated by the skilled artisan.

In accordance with various embodiments of the present disclosure, the methods described herein may be implemented using a hardware computer system that executes software programs on stored a computer readable medium or other memory device.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

For purposes of this document, each process associated with the disclosed technology may be performed continuously and by one or more computing devices. Each step in a process may be performed by the same or different computing devices as those used in other steps, and each step need not necessarily be performed by a single computing device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A programmable logic device (PLD), comprising:
   a configuration bus;
   a plurality of programmable hardware units coupled to the configuration bus, each of the programmable hardware units configurable with one of a plurality of functional modes;
   a plurality of switch devices to independently select one or more configuration patterns from a set of configuration patterns, each of the switch devices corresponding to one of the programmable hardware units;
   a plurality of configuration registers coupled to the configuration bus and commonly shared by the plurality of programmable hardware units, the configuration registers storing the set of configuration patterns, where each configuration pattern corresponds to one of the plurality of functional modes of the programmable hardware units;
   a memory storing a set of index groups, each index group including a set of indices, configured to identify one of the plurality of configuration registers by selecting a corresponding select line on a corresponding one of the switch devices using a corresponding index in the set of indices; and
   one or more of the plurality of programmable hardware units accessing the configuration pattern, via the configuration bus, from the selected configuration register for configuration with the configuration pattern retrieved from the selected configuration register.

2. The PLD of claim 1, wherein each of the switch devices is a multiplexer having a number of select lines equal to a number of configuration patterns.

3. The PLD of claim 1, wherein the set of indices of one of the index groups is accessed to independently select, via an input line, a corresponding index associated with one or more of the plurality of switch devices to access the configuration registers for configuring the one or more plurality of programmable hardware units with a corresponding one of the plurality of functional modes.

4. The PLD of claim 1, wherein the memory is addressed to read another set of indices of another one of the index groups to configure the one or more plurality of programmable hardware units with another one or more of the plurality of functional modes.

5. The PLD of claim 4, wherein the one or more configuration patterns stored in the set of the configuration registers is exchanged with the updated configuration patterns when unused for a predetermined period.

6. The PLD of claim 1, further comprising a runtime system controller to simultaneously schedule updating the configuration patterns in the plurality of configuration registers and access the configuration patterns from the plurality of configuration registers to configure the plurality of programmable hardware units.

7. The PLD of claim 6, wherein one or more of the plurality of configuration registers are accessible at a same time by addressing one or more of the switching devices.

8. The PLD of claim 1, further comprising
   a configuration storage comprising the plurality of configuration registers having a depth of a total number of the one or more functional modes of the plurality of programmable hardware units; and
   an index memory having a width of the number of the plurality of programmable hardware units multiplied by a number of bits to identify a depth D, where $D=2^S$, wherein
   the number of the plurality of programmable hardware units and the number of the plurality of switch devices are the same.

9. The PLD of claim 8, wherein the number of configuration registers in the plurality of configuration registers is selected according a number of frequently used configuration patterns and a number of least frequently used configuration patterns, such that the total number of configuration registers is less than the total number of functional modes.

10. The PLD of claim 1, wherein the programmable logic device is one of a FGPA, ASIC, SoC and EEPROM.

11. The PLD of claim 1, wherein the total number of configurations patterns for the total number of programmable hardware units is equal to a depth of the index groups.

12. A method for configuring a programmable logic device (PLD), comprising:
    storing a set of configuration patterns in commonly shared configuration registers of a configuration memory such that each of the configuration patterns correspond to one or more functional modes of a plurality of programmable hardware units;
    independently selecting one or more configuration patterns from the set of configuration patterns using one or more switch devices, each of the switch devices corresponding to one of the programmable hardware units;
    storing, in an index memory, an index of addresses configured to identify one of a plurality of select lines of the switching device to address a corresponding one of the plurality of configuration registers; and
    accessing one of the configuration patterns by addressing the index memory to select one of the plurality of configuration registers to configure one of the programmable hardware units with the configuration pattern retrieved from the selected configuration register.

13. The method of claim 12, wherein the configuration memory comprises static random access memory and the index memory comprises electrically erasable programmable read only memory.

14. The method of claim 12, wherein each of the one or more switch devices is a multiplexer having a number of select lines equal to a number of configuration patterns.

15. The method of claim 12, further comprising a controller sending an address to the configuration memory to read a group of indices, each of the indices in the group of indices corresponding to an input of each of the one or more switch devices.

16. The method of claim 12, further comprising
    configuring one or more of the plurality of programmable hardware units by reading the one or more configuration patterns stored in at least one of the configuration registers; and simultaneously updating at least another one of the configuration registers with updated configuration patterns.

17. The method of claim 16, further comprising exchanging the one or more configuration patterns stored in the at least another one of the configuration registers with the updated configuration patterns when unused for a predetermined period.

18. The method of claim 12, further comprising, during runtime,
simultaneously scheduling updates to the configuration patterns in the plurality of configuration registers; and
accessing the configuration patterns from the plurality of configuration registers to configure the plurality of programmable hardware units.

19. The method of claim 18, wherein one or more of the plurality of configuration registers are accessible at a same time by addressing one or more of the switching devices.

20. The method of claim 12, wherein
the configuration memory has a depth of a total number of the one or more functional modes of the plurality of programmable hardware units, and
the index memory has a width of the number of the plurality of programmable hardware units multiplied by a number of bits to identify a depth D, where $D=2^S$, wherein
the number of the plurality of programmable hardware units and the number of the plurality of switch devices are the same.

21. The method of claim 12, further comprising providing a number of configuration registers in the plurality of configuration registers according a number of frequently used configuration patterns and a number of least frequently used configuration patterns, such that the total number of configuration registers is less than the total number of functional modes.

22. The method of claim 12, wherein the programmable logic device is one of a FGPA, ASIC, SoC and EEPROM.

23. The method of claim 12, wherein the total number of configurations patterns for the plurality of programmable hardware units is equal to a depth of the configuration memory.

24. A programmable logic device (PLD), comprising:
a plurality of programmable hardware units configurable with one of a plurality of functional modes;
a plurality of switch devices to select a configuration pattern from a set of configuration patterns, each of the switch devices corresponding to one of the programmable hardware units;
a plurality of configuration registers commonly shared by the plurality of programmable hardware units, the configuration pattern corresponding to one of the plurality of functional modes;
a memory storing a set of index groups configured to identify one of the plurality of configuration registers by selecting a corresponding select line on a corresponding one of the switch devices using a corresponding index from a set of indices in one of the index groups; and
one or more of the plurality of programmable hardware units accessing the configuration pattern from the selected configuration register for configuration with the configuration pattern retrieved from the selected configuration register.

25. The PLD of claim 24, further comprising
a configuration bus coupling the plurality of programmable hardware units and the plurality of configuration registers, and wherein each of the switch devices corresponds to one of the programmable hardware units.

26. The PLD of claim 24, wherein the configuration registers store the set of configuration patterns.

27. The PLD of claim 24, further comprising a runtime system controller to simultaneously schedule updating the configuration pattern stored in each of the plurality of configuration registers and access the configuration patterns from the plurality of configuration registers to configure the plurality of programmable hardware units.

* * * * *